United States Patent
Farhadi Nia et al.

(10) Patent No.: US 11,422,284 B2
(45) Date of Patent: Aug. 23, 2022

(54) SYSTEM FOR IMPROVED RESERVOIR EXPLORATION AND PRODUCTION

(71) Applicant: Beyond Limits, Inc., Glendale, CA (US)

(72) Inventors: Shahram Farhadi Nia, Glendale, CA (US); Zackary H. Nolan, Los Angeles, CA (US); Azarang Golmohammadizangabad, Los Angeles, CA (US)

(73) Assignee: Beyond Limits, Inc., Glendale, CA (US)

( * ) Notice: Subject to any disclaimer, the term of this patent is extended or adjusted under 35 U.S.C. 154(b) by 726 days.

(21) Appl. No.: 16/157,716

(22) Filed: Oct. 11, 2018

(65) Prior Publication Data

US 2019/0107642 A1  Apr. 11, 2019

Related U.S. Application Data (60) Provisional application No. 62/571,150, filed on Oct. 11, 2017.

(51) Int. Cl.
*G01V 99/00* (2009.01)
*G06N 3/08* (2006.01)
(Continued)

(52) U.S. Cl.
CPC ............ *G01V 99/005* (2013.01); *G06F 30/20* (2020.01); *G06N 3/04* (2013.01); *G06N 3/0436* (2013.01);
(Continued)

(58) Field of Classification Search
CPC ...... G01V 99/005; G06F 30/20; G06N 3/088; G06N 3/0436; G06N 3/0454; G06N 3/08; G06N 3/04
See application file for complete search history.

(56) References Cited

U.S. PATENT DOCUMENTS 11,143,789 B2   10/2021   Golmohammadizangabad
2004/0133531 A1  7/2004   Chen et al.
(Continued)

FOREIGN PATENT DOCUMENTS

WO   WO 2016/140645   9/2016
WO   WO 2017/079178   5/2017
(Continued)

OTHER PUBLICATIONS

PCT Application No. PCT/US2018/055471 International Preliminary Report on Patentability dated Apr. 14, 2020.
(Continued)

*Primary Examiner* — Steven W Crabb
(74) *Attorney, Agent, or Firm* — Polsinelli LLP (57) ABSTRACT

An architecture for predicting and modeling geological characteristics of a reservoir includes one or more neural networks, a static modeling module, a dynamic modeling module, and a fuzzy inference engine to provide recommendations for drilling a wellbore. The neural networks receive log data for coordinates along a well trajectory, and determine a geophysical relationship for a property of a subterranean formation as a function of distance vectors between the coordinates along the well trajectory and one or more sets of randomly generated coordinates. The static modeling module generates three-dimensional static models of a volume of interest based on predicted properties of formations residing therein from the neural networks. The dynamic modeling module determines connectivity values between clusters of formations based on nodal connectivity of neighboring clusters, assigns pressure values across the volume of interest, and generates a three-dimensional dynamic model for the volume of interest based on the pressure values.

20 Claims, 9 Drawing Sheets

(51) Int. Cl.
*G06N 3/04* (2006.01)
*G06F 30/20* (2020.01)

(52) U.S. Cl.
CPC ............. *G06N 3/0454* (2013.01); *G06N 3/08* (2013.01); *G06N 3/088* (2013.01)

(56) References Cited

U.S. PATENT DOCUMENTS

| | | |
|---|---|---|
| 2006/0285436 A1 | 12/2006 | Mayorga et al. |
| 2009/0020284 A1 | 1/2009 | Graf et al. |
| 2009/0119018 A1 | 5/2009 | Priezzhev et al. |
| 2009/0204377 A1 | 8/2009 | Van Wagoner et al. |
| 2010/0235154 A1 | 9/2010 | Meurer et al. |
| 2011/0002194 A1 | 1/2011 | Imhof et al. |
| 2012/0203525 A1 | 8/2012 | Rodriguez Herrera et al. |
| 2012/0221306 A1 | 8/2012 | Hurley et al. |
| 2013/0124171 A1 | 5/2013 | Schuette et al. |
| 2015/0066460 A1 | 3/2015 | Klinger et al. |
| 2015/0300151 A1 | 10/2015 | Mohaghegh |
| 2015/0347898 A1* | 12/2015 | Hiu ..................... G06N 3/06 706/21 |
| 2016/0078345 A1 | 3/2016 | Rajati et al. |
| 2016/0259088 A1 | 9/2016 | Carvajai et al. |
| 2017/0336811 A1 | 11/2017 | Stone et al. |
| 2018/0188403 A1* | 7/2018 | Halsey ................... G01V 1/306 |
| 2018/0321421 A1 | 11/2018 | Halabe et al. |
| 2019/0107643 A1 | 4/2019 | Golmohammadizangabad |
| 2019/0107644 A1 | 4/2019 | Nia |
| 2019/0107645 A1 | 4/2019 | Nolan |
| 2022/0026598 A1 | 1/2022 | Golmohammadizangabad |

FOREIGN PATENT DOCUMENTS

| | | |
|---|---|---|
| WO | WO 2019/075242 | 4/2019 |
| WO | WO 2019/075245 | 4/2019 |
| WO | WO 2019/075247 | 4/2019 |
| WO | WO 2019/075250 | 4/2019 |

OTHER PUBLICATIONS

PCT Application No. PCT/US2018/055475 International Preliminary Report on Patentability dated Apr. 14, 2020.
PCT Application No. PCT/US2018/055477 International Preliminary Report on Patentability dated Apr. 14, 2020.
PCT Application No. PCT/US2018/055480 International Preliminary Report on Patentability dated Apr. 14, 2020.
PCT/US18/55471, System for Improved Reservoir Exploration and Production, Filing Date Oct. 11, 2018.
U.S. Appl. No. 16/157,732, Azarang Golmohammadizangabad, Static Engine and Neural Network for a Cognitive Reservoir System, filed Oct. 11, 2018.
PCT/US18/55476, Static Engine and Neural Network for a Cognitive Reservoir System.
U.S. Appl. No. 16/157,757, Shahram F. Nia, Dynamic Engine for a Cognitive Reservoir System, filed Oct. 11, 2018.
PCT/US18/55477, Dynamic Engine for a Cognitive Reservoir System, Filing Date Oct. 11, 2018.
U.S. Appl. No. 16/157,764, Zackary H. Nolan, Recommendation Engine for a Cognitive Reservoir System, filed Oct. 11, 2018.
PCT/US2018/55480, Recommendation Engine for a Cognitive Reservoir System, Filing Date Oct. 11, 2018.
U.S. Appl. No. 16/157,732 Office Action dated Jan. 4, 2021.
PCT Application No. PCT/US2018/055471 International Search Report and Written Opinion dated Jan. 7, 2019.
PCT Application No. PCT/US2018/055477 International Search Report and Written Opinion dated Jan. 7, 2019.
PCT Application No. PCT/US2018/055480 International Search Report and Written Opinion dated Dec. 31, 2018.
PCT Application No. PCT/US2018/055475 International Search Report and Written Opinion dated Feb. 5, 2019.
U.S. Appl. No. 17/497,477, Azarang Golmohammadizangabad, Static Engine and Neural Network for a Cognitive Reservoir, Filing Date Oct. 8, 2021.
U.S. Appl. No. 16/157,764 Office Action dated Aug. 25, 2021.
U.S. Appl. No. 16/157,757 Office Action dated Jan. 19, 2022.

* cited by examiner

PREDICTED LOG DATA
FOR RESERVOIR

FORMATION "CLUSTERS"
(E.G., FROM STATIC MODEL 112)

VERTICES OF CLUSTERS
(E.G., FROM DYNAMIC MODEL 122)

*FIG. 6*

PRESSURE CONNECTIVITY

NODAL FAULT PLANE(S)

NEIGHBORING CONNECTIVITY

CLUSTER FAULT PLANE(S)

SYSTEM FOR IMPROVED RESERVOIR EXPLORATION AND PRODUCTION

CROSS REFERENCE TO RELATED APPLICATIONS

The present application claims priority under 35 U.S.C. § 119 to U.S. Provisional Patent Application Ser. No. 62/571,150, entitled "Techniques for Improved Reservoir Exploration and Production" and filed on Oct. 11, 2017, the contents of which are incorporated herein by reference to their entirety.

TECHNICAL FIELD

The present subject matter relates generally to natural resource extraction from earth formations (e.g., a reservoir), and more particularly, to modeling properties of the earth formations using neural networks to optimize resource extraction.

BACKGROUND

Reservoirs, in the oil and gas industry, include earthen formations that contain oil, gas, petroleum hydrocarbons, and so on. In order to efficiently extract the desired natural resources from subsurface earthen formations, one or more wells (e.g., wellbores, boreholes, etc.) are drilled into the earth and resources are pumped to the surface according to a comprehensive well plan. Developing comprehensive well plans is a complex and time consuming process where a suite of experts analyze and evaluate reservoir data, predict where wellbores should be drilled, and establish appropriate rates of resource recovery in order to prevent damage to the reservoir (e.g., caused by pressure changes, water coning, etc.), and so on.

Advances in modern technology help reservoir management and facilitate development of comprehensive well plans. For example, some advances relate to improving the accuracy of measurement data, which is used to determine characteristics about the earthen formation. These characteristics are often derived from well data (e.g., log data, seismic data, etc.) and are used to further create geophysical models of the reservoir. Well logging is the process to obtain log data that represents the characteristics of subsurface geologies in the vicinity of a borehole or a wellbore. Well logging techniques include, for example, wireline logging, logging while drilling (LWD), measurement while drilling (MWD), and so on. These well logging techniques employ sophisticated equipment to measure various geophysical and seismic characteristics of earth materials in/around a borehole such as acoustic or sonic pressure pulses/waves (e.g., Stoneley waves, etc.), nuclear magnetic resonance (NMR), seismic activity, gamma irritation, and so on. Often, however, conventional geophysical models and modeling techniques only provide basic estimations about the subsurface geology, which lack granularity that may help avoid potential issues associated with reservoir management (e.g., drilling, borehole stability, and natural resource extraction, etc.)

SUMMARY

This disclosure describes a comprehensive architecture for predicting and modeling geological characteristics of a reservoir. The architecture generally includes one or more neural networks, a static modeling module, a dynamic modeling module, and a fuzzy inference engine to provide recommendations for drilling a wellbore. As discussed herein, this comprehensive architecture may be embodied by various systems, devices, processes, modules, sub-modules, and so on.

In one example embodiment, one or more neural networks receive log data for coordinates along a well trajectory and determine a geophysical relationship for a property of a subterranean formation as a function of distance vectors between the coordinates along the well trajectory and one or more sets of randomly generated coordinates. The neural networks also determine predicted properties for a volume of interest based on the geophysical relationship. A static modeling module, in communication with the neural networks, generates a three-dimensional static model for the volume of interest based on the predicted properties. The static modeling module and/or a dynamic modeling module (in communication with the static modeling module) further assigns portions of the volume of interest to one or more clusters based on the predicted properties, and determines connectivity values between clusters based on a nodal connectivity of neighboring clusters. The dynamic modeling module further assigns pressure values across the volume of interest of the three-dimensional static model based on the connectivity values, and generates a three-dimensional dynamic model for the volume of interest based on the pressure values. The fuzzy inference engine evaluates the three-dimensional static model and the three-dimensional dynamic model based on a set of rules executed by a fuzzy interference engine, and provides a recommendation for drilling a wellbore in the volume of interest.

These and other implementations are described and recited herein. Further, while multiple implementations are disclosed, still other implementations of the presently disclosed technology will become apparent to those skilled in the art from the following detailed description, which shows and describes illustrative implementations of the presently disclosed technology. As will be realized, the presently disclosed technology is capable of modifications in various aspects, all without departing from the spirit and scope of the presently disclosed technology. Accordingly, the drawings and detailed description are to be regarded as illustrative in nature and not limiting.

BRIEF DESCRIPTION OF THE DRAWINGS

The embodiments herein may be better understood by referring to the following description in conjunction with the accompanying drawings in which like reference numerals indicate identical or functionally similar elements. Understanding that these drawings depict only exemplary embodiments of the disclosure and are not therefore to be considered to be limiting of its scope, the principles herein are described and explained with additional specificity and detail through the use of the accompanying drawings in which.

DESCRIPTION OF EXAMPLE EMBODIMENTS

Various embodiments of the disclosure are discussed in detail below. While specific implementations are described in detail, it should be understood that this is done for illustration purposes only. A person skilled in the relevant art will recognize that other components and configurations may be used without departing from the spirit and scope of the disclosure.

As provided herein, this disclosure relates to new approaches for modeling geological formations for reservoirs or well environments. As noted above, conventional geophysical models often only provide basic estimations about the subsurface geology, which lack the granularity that may help avoid potential issues associated with drilling, borehole stability, natural resource extraction, and so on. For example, some geophysical models are constructed based on a measured data (e.g., log data, seismic data, etc.) and rely upon analysis from a number of specialists.

Geostatistical models, e.g. Kriging, often rely on fundamental principles of spatial connectivity between subsurface earthen formations. As the distance between two data points (e.g., subsurface positions) decreases, the similarity between the two measurements increases and vice versa. Geostatistical models model spatial variability, which includes scales of connectivity (heterogeneity) and directionality within data sets. For example, various geostatistical techniques such as kriging, Gaussian process regression, and so on, estimate regionalized characteristics of subsurface earthen formation at selected grid points. However, as mentioned, such geostatistical techniques and resultant geophysical models often lack flexibility to adjust to the local data and are guided by globally pre-assigned fixed kernels, which can negatively impact a well plan. Moreover, many geophysical models fail to account for human factors such as inter-discipline (and inter-expert) disagreements. As mentioned above, developing a comprehensive well plan often involves a number of complex decisions, interpretations, and assignments of characteristics to measured data from a number of experts in various fields. Conventional geophysical models do not account for disagreements between experts and/or fail to capture (or quantify) this type of uncertainty, which may affect the accuracy of resultant geophysical models.

Accordingly, the embodiments of this disclosure provide a comprehensive geophysical modeling architecture and improved geophysical modeling techniques particularly suited for reservoir environments. This geophysical architecture leverages novel approaches to evaluate measured data and produce comprehensive and detailed geophysical models of subterranean earthen formations that form a reservoir. For example, as discussed herein, the geophysical architecture includes a static engine/module, a dynamic engine/module, and a recommendation engine/module. As used herein, the terms "engine," "module," "sub-module," and/or "model" may be interchangeably used, and these terms generally refer to computer program logic or software processes that provide specified functionality. In this fashion, an engine or a module can be implemented in hardware, firmware, and/or software, including combinations thereof.

Figure 1:
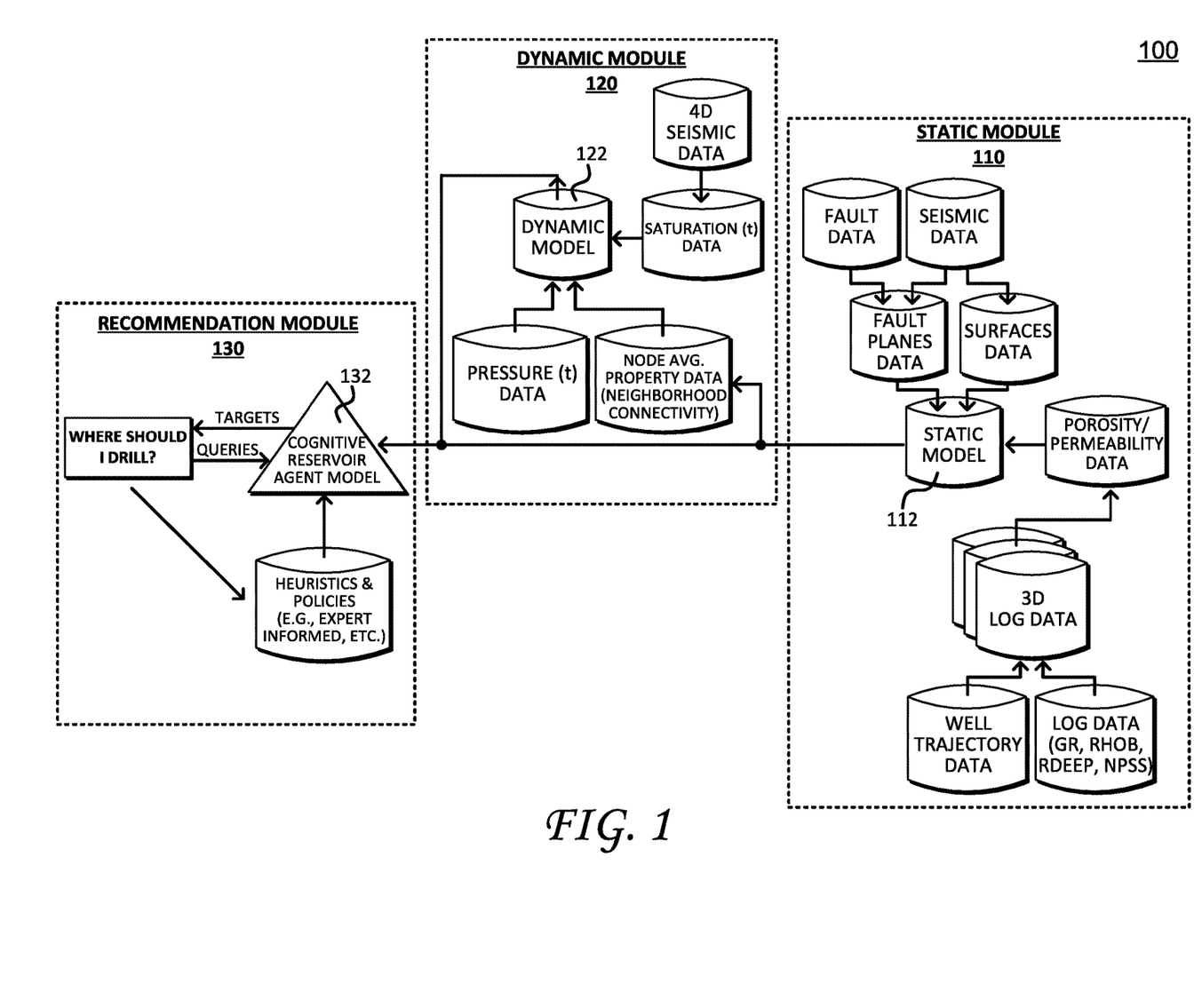
FIG. 1 illustrates a schematic block diagram of exemplary reservoir modeling architecture.

Referring to the figures, FIG. 1 illustrates a schematic block diagram of a representative comprehensive geophysical modeling architecture 100. Geophysical modeling architecture 100 includes various engines or modules, such as a static module 110, a dynamic module 120, and a recommendation module 130.

As discussed in greater detail herein, static modeling module 110 generally operates to generate static models of geological formations for the reservoir based on various types of measured or observed data (e.g., log data, well trajectories, assigned rock properties, fault polygons, etc.). The dynamic modeling module 120 generally generates dynamic models that account for changing aspects (e.g., pressure, production, connectivity, etc.) of the geological formations as natural resources are extracted over the lifetime of the reservoir. The recommendation module generally applies heuristics and policies to evaluate static data and dynamic data. The recommendation module further provides an answer to the question "where should I drill," and an explanation of the logical steps that resulted in the answer.

As illustrated, static module 110 includes a static model 112 that generally operates to create a static representation of conditions and/or characteristics of subterranean earthen formations of a reservoir based on measured or observed data. In operation, static model 112 receives various types of measured or observed data for known locations (e.g., well-bores, well trajectories, etc.), and translates the measured data into predicted data for a reservoir volume using a neural network approach. The predicted data is subsequently used to generate models of rock formations/characteristics in the reservoir volume.

Notably, the various types of measured data include fault data, seismic data, well trajectory data, log data (e.g., gamma ray data (GR), bulk density data (RHOB), neutron porosity sandstone matrix (NPSS) data, sandstone density porosity (DPSS), deep resistivity data (RDEEP), etc.), and so on. Static module 110 operably receives this measured data from, for example, logging equipment as is appreciated by those skilled in the art. Log data represents concise, detailed plots of formation parameters that are captured at specified depths using logging tools deployed along a well trajectory.

In addition, static module 110 can analyze portions of the measured data to generate refined static data. For example, static module 110 evaluates and combines measured data such as fault data and seismic data to create refined static data such as fault planes data, which is important for understanding connectivity and other attributes related to hydrocarbon recovery. In addition, static module 110 analyzes the seismic data to create surface(s) data. In some embodiments, static module 110 evaluates other measured data such as the well trajectory data and log data to determine 3D-log data, which in turn, may be further analyzed to determine porosity/permeability data (e.g., k, Sw, phi values, etc.) In this fashion, static module 110 can process initial measured data to create refined static data. Static model 112 operably evaluates the initial measured data and/or the refined static data to generate static models of conditions and/or characteristics (e.g., rock properties, fluid concentrations, compartments, etc.) of the reservoir based on the measured or observed data. As described herein, static module 110 can use a chain of supervised and/or unsupervised machine learning algorithms in conjunction with one or more neural networks to determine static properties of the reservoir while also quantifying and preserving uncertainty.

In some embodiments, static module 110 may automatically process the measured data to generate the additional measured data, while in other embodiments, static module 110 may provide tools (e.g., user interfaces, etc.) to solicit input from experts and/or tools to help experts evaluate the initial measured data and generate the refined static data.

Dynamic module 120 includes a dynamic model 122 that generates dynamic models of the reservoir over time. For example, extracting fluids or gases such as hydrocarbons, water, and methane, and so on, can cause pressure changes within the reservoir. These pressure changes may affect borehole stability, inter-formation connectivity, fault planes between formations, water saturation, permeability, and the like. Further, these dynamic changes can affect rates of safe resource recovery and overall natural resource availability. The dynamic model 122 accounts for these changes, which are represented by dynamic data, and generate time-based and forward-looking models of the earthen formations and/or fluids within reservoir. In this fashion, the dynamic models predict changes to the subterranean earthen formations of the reservoir over its' lifetime (e.g., as resources are extracted). These changes may be used to inform the initial comprehensive well plan and/or these changes may be used during resource extraction to maximize efficient resource recovery.

As shown here, dynamic model 122 receives various types of dynamic data such as 4D seismic data, which may be evaluated to determine saturation data, node average property data (e.g., neighborhood/nearest-neighbor connectivity), pressure data, and so on.

Recommendation module 130 includes a reservoir development reasoning system/model 132, which provides recommendations to answer the question—"where should I drill." In particular, reservoir development reasoning model 132 can include a fuzzy inference engine that applies heuristics/policies to evaluate underlying reservoir representation data (e.g., including volumes of interest), against a set of guiding heuristics or policies. For example, reservoir development reasoning model 132 can evaluate the dynamic models (e.g., dynamic data) and/or the static models (e.g., static data) to form a comprehensive recommendation. With respect to the heuristics/policies, reservoir development reasoning model 132 may evaluate factors such as environmental impact, equipment capability (e.g., top side system capabilities may limit the amount of oil that can be safely extracted due to gas flaring limits, water recycling, and so on), risk policies, and so on.

In some embodiments, reservoir development reasoning model 132 returns volumes in a ranked list. For each volume, the inference engine can provide a reasoning trace that describes, in relative and absolute terms, how the ranking was produced. Reservoir development reasoning model 132 can further monitor the heuristics, policies, and underlying data sources for new inputs/changes and provide an instantaneous reranking of the volumes of interest.

Figure 2:
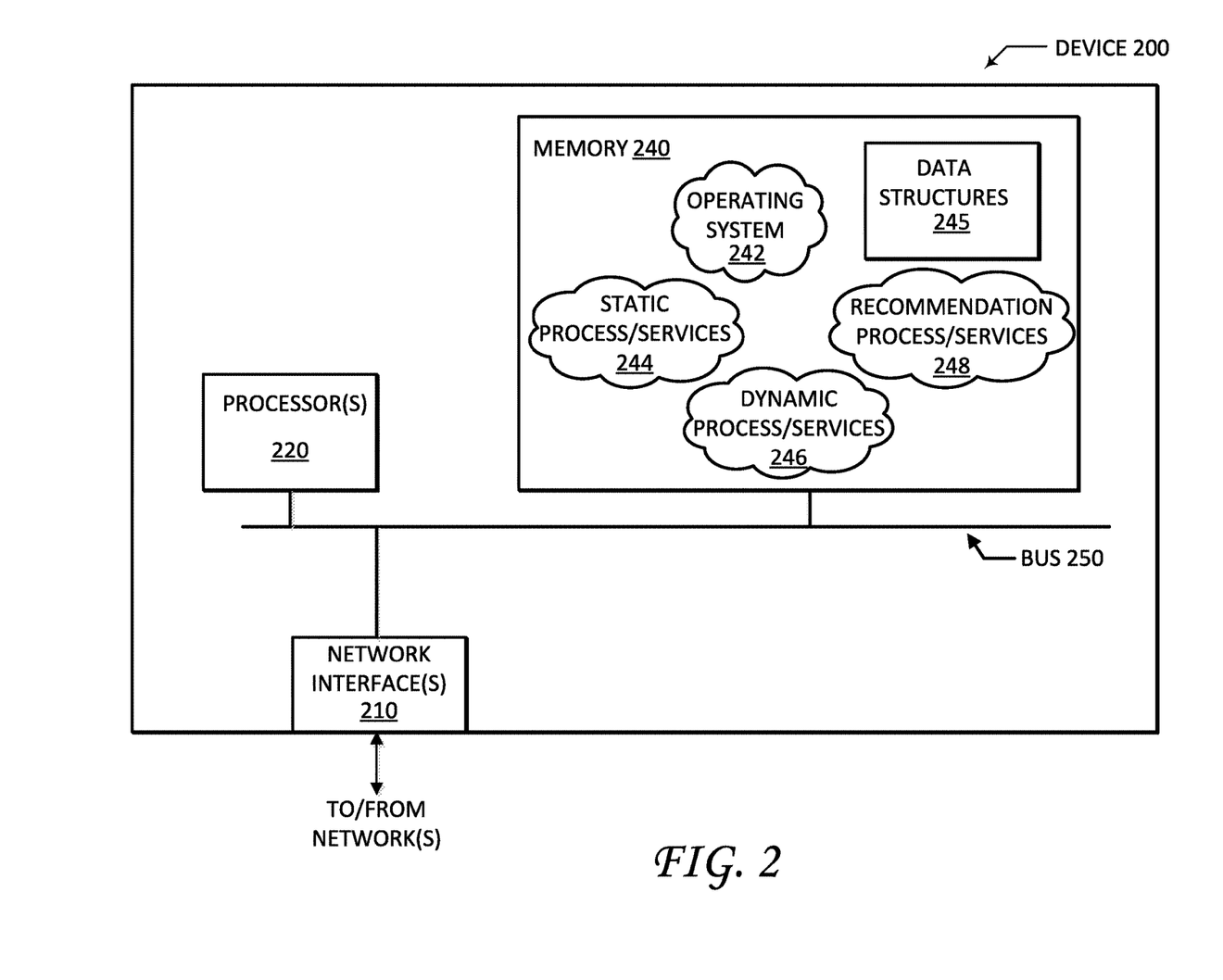
FIG. 2 illustrates a schematic block diagram of an exemplary network device, such as a one of the modules (or sub-modules) of the geophysical modeling architecture, according to one or more embodiments of this disclosure.

FIG. 2 illustrates a schematic block diagram of an exemplary device 200 for modeling geological formations in reservoirs or well environments. Device 200 may be used with one or more embodiments described herein, e.g., particularly as a component part of the geophysical modeling architecture 100, including the various modules, sub-modules disclosed herein.

Device 200 comprises one or more network interfaces 210, at least one processor 220, and a memory 240 interconnected by a system bus 250. Network interface(s) 210 contain the mechanical, electrical, and signaling circuitry for communicating data over links (e.g., wires or wireless links) and/or between modules/sub-modules of the geophysical modeling architecture 100. Network interfaces 210 may be configured to transmit and/or receive data using a variety of different communication protocols, as will be understood by those skilled in the art.

Memory 240 comprises a plurality of storage locations that are addressable by processor 220 for storing software programs and data structures associated with the embodiments described herein. Processor 220 may comprise necessary elements or logic adapted to execute the software programs and manipulate data structures 245. An operating system 242, portions of which are typically resident in memory 240 and executed by processor 220, functionally organizes the device by, inter alia, invoking operations in support of services and/or software processes executing on the device/module.

These services and/or software processes may comprise an illustrative "static" process/service 244, "dynamic" process/service 246, and/or "recommendation" process/service 248, as described herein. Note that while the processes/services 244, 246, and 248 are shown in centralized memory 240, these processes/services are modular and can be operated in a distributed communication network, as is appreciated by those skilled in the art. Moreover, the techniques for modeling geological formations may be performed by hardware, software, and/or firmware, such as in accordance with one or more of the illustrated processes/services. In this fashion, the illustrated processes/services may contain computer executable instructions executed by processor 220 to perform functions relating to the same.

It will be apparent to those skilled in the art that other processor and memory types, including various computer-readable media, may be used to store and execute program instructions pertaining to the techniques described herein. Also, while the description illustrates various processes, it is expressly contemplated that various processes may be embodied as modules configured to operate in accordance with the techniques herein (e.g., according to the functionality of a similar process). Further, while the processes have been shown separately, those skilled in the art will appreciate that processes may be routines or modules within other processes. For example, processor 220 can include one or more programmable processors, e.g., microprocessors or microcontrollers, or fixed-logic processors. In the case of a programmable processor, any associated memory, e.g., memory 240, may be any type of tangible processor readable memory, e.g., random access, read-only, etc., that is encoded with or stores instructions that can implement program modules. Processor 220 can also include a fixed-logic processing device, such as an application specific integrated circuit (ASIC) or a digital signal processor that is configured with firmware comprised of instructions or logic that can cause the processor to perform the functions described herein. Thus, program modules may be encoded in one or more tangible computer readable storage media for execution, such as with fixed logic or programmable logic, e.g., software/computer instructions executed by a processor, and any processor may be a programmable processor, programmable digital logic, e.g., field programmable gate array, or an ASIC that comprises fixed digital logic, or a combination thereof. In general, any process logic may be embodied in a processor or computer readable medium that is encoded with instructions for execution by the processor that, when executed by the processor, are operable to cause the processor to perform the functions described herein.

Figure 3:
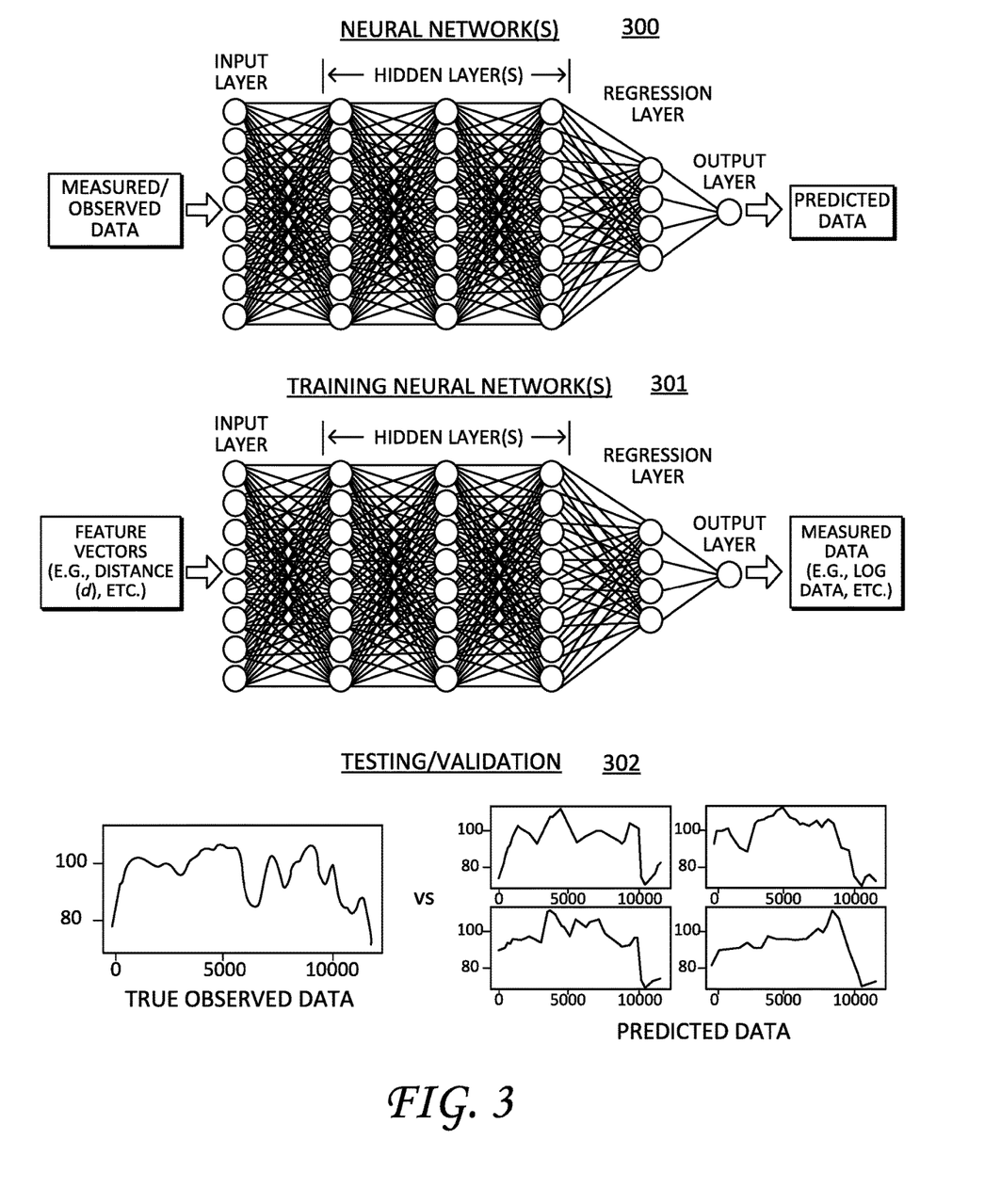
FIG. 3 illustrates various schematic block of a neural network approach to generating a static geophysical model.

FIG. 3 illustrates various schematic diagrams of a neural network approach to generating a static geophysical model, which may be used in conjunction with one or more of the above-discussed modules (e.g., static module 110). While other modeling approaches (e.g., kriging), which depend on certain modeling assumptions (e.g., fixed assumptions based on minimal variance, etc.), the modeling techniques disclosed herein minimize assumptions and instead leverage neural networks, such as neural network 300, to mimic the physics of geophysical structures. Neural networks generally refer to nonlinear pattern recognition tools that often require training data to develop relationships between inputs and outputs of a known dataset.

As illustrated, FIG. 3 includes a schematic diagram of a neural network 300, a schematic diagram for training neural networks 301, and a schematic diagram showing testing and/or validation 302 to evaluate the trained neural networks. Neural network 300 generally represents a machine learning network that includes various convolutional or "hidden" layers as well as a number of interconnected neurons or nodes. Neural network 300 operably learns how to convert input signals (e.g. distance vectors) into corresponding output signals (e.g., predicted static data), which are used to create the subterranean geophysical models disclosed herein. Notably, neural network 300 represents a "final" or "trained" neural network that receives measured or observed data (e.g., static data) for a known coordinate and provides predicted data as an output. The predicted data represents predicted features for subterranean formations in the reservoir for a given volume of interest, which can include the total volume of the reservoir.

In order to create neural network 300, a number of neural networks are typically trained as shown by representative neural network 301. With respect to training, neural network 301 is provided with desired inputs and outputs. Neural network 301 develops a predictive relationship between the inputs and outputs based on a learning algorithm. This process is iteratively repeated for a number of neural networks, which may be further screened and selected based on accuracy, testing, and validation results.

For example, neural network 301 can determine a pattern or relationship between feature vectors (e.g., Euclidean distance vectors) and measured data (e.g., log data, etc.) for known coordinates. In this fashion, neural network 301 and similarly trained neural networks can develop predictive relationships between geophysical characteristics and distances from known locations/known features. Put differently, neural network 301 determines geophysical characteristics for an unknown coordinate as a function of distances between the unknown coordinate and geophysical characteristics measured at a number of known coordinates.

After training, each neural network (e.g., neural network 301) is tested and validated against other known inputs and outputs that were not part of the training dataset, as shown by testing validation 302. Generally, the closer a particular neural network is at predicting the actual outputs from the known inputs for the testing data, the better the neural network fits the dataset. Any number of methods for testing and validating the neural networks may be used as is appreciated by those skilled in the art. Further, after training and validation, one or more neural networks can be selected to as a predictive model to predict the geophysical characteristics of subterranean earthen formations at unknown coordinates in the reservoir.

Figure 4:
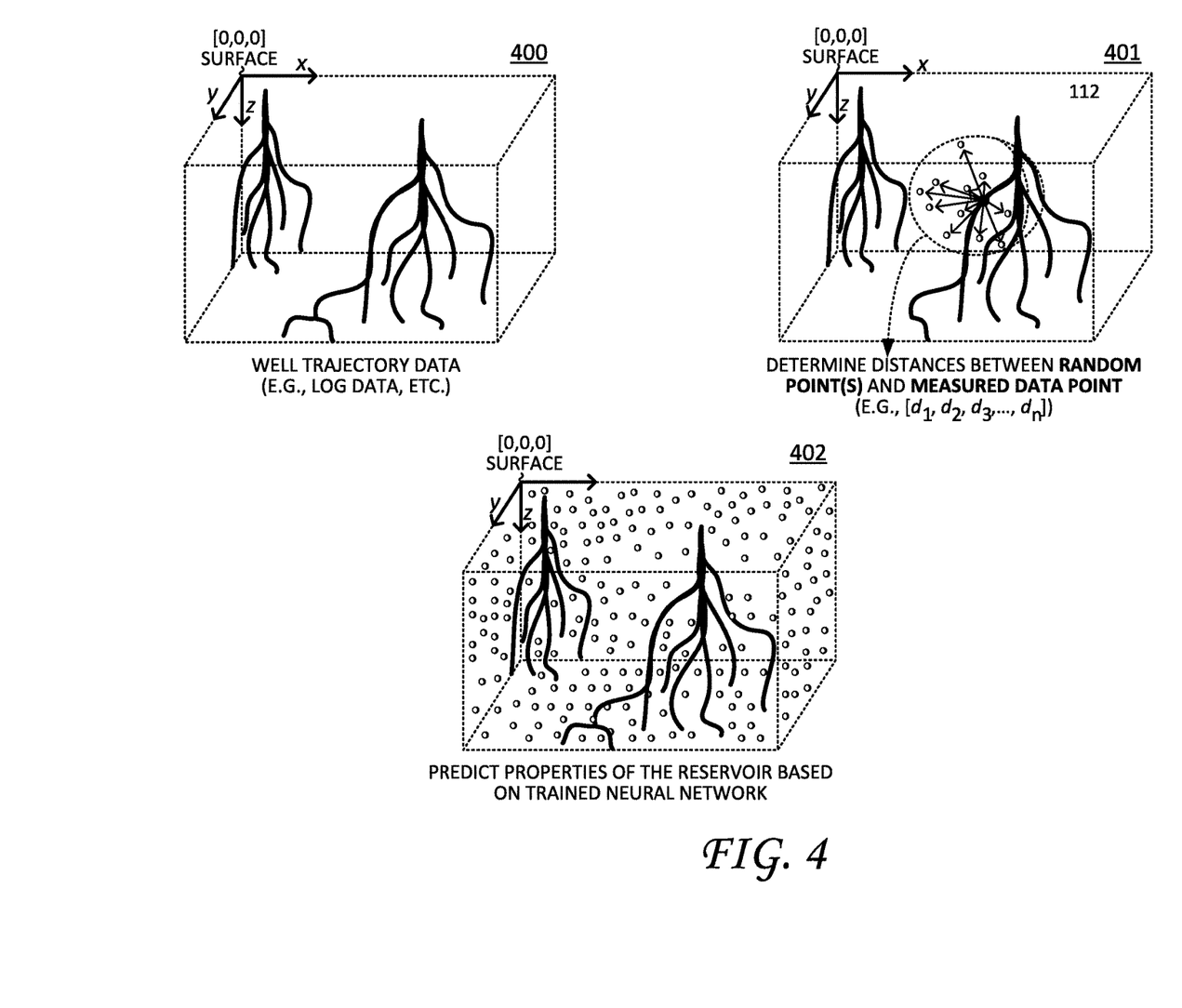
FIG. 4 illustrates various schematic diagrams that represent processes to train a neural network and predict characteristics or properties for a reservoir.

FIG. 4 illustrates schematic diagrams that represent processes to train a neural network and predict characteristics or properties for a reservoir. Diagram 400 particularly illustrates log data measured along a well trajectory (e.g., a wellbore) through the reservoir. As discussed above, the log data represents a set of observed data points at known coordinates (e.g., x, y, z) in a volume along a well trajectory.

Diagram 401 graphically illustrates training one or more neural networks. As shown, the neural network determines distance vectors between sets of random coordinates and each observed or measured data point along the well trajectory. The neural networks process these distance vectors and develop geophysical relationship for properties of the subterranean formations as a function of distance (e.g., Euclidean distances). In this fashion, training data inputs for the neural networks are represented by the distance vectors while the training data outputs are represented by the known property at a given coordinate of the well trajectory. In other words, for each coordinate of the well trajectory, the training data input includes [distance 1, distance 2, distance 3, . . . distance n]. For example, for a gamma ray (GR) feature or property, the training data is defined as: {(input1,GR1), (input2,GR2), (input3,GR3), . . . , (inputN,GRN)}.

Once trained, the neural networks generates a set length-n feature vectors for every location in the 3D volume of the volume of interest (e.g., the total volume of the reservoir). Stated differently, the trained neural networks predict the value of static log data for the entire field, thereby generating 3D populated logs.

Notably, as mentioned, the resultant 3D populated logs include uncertainty, which may be quantified by analyzing multiple iterations or "realizations" of the 3D populated logs, each using a different set of randomly generated numbers.

Figure 5:
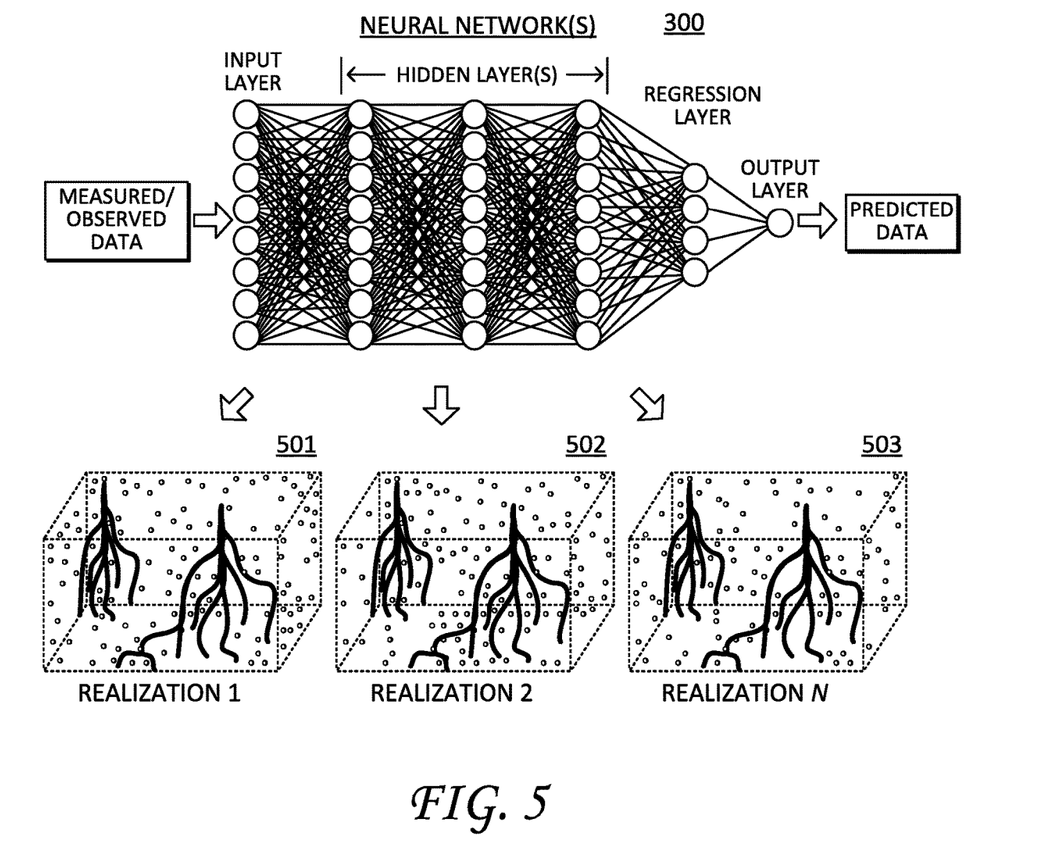
FIG. 5 illustrates a schematic block diagram of a neural network generating multiple 3D populated logs or realizations.

For example, FIG. 5 illustrates a schematic block diagram of neural network 300 generating multiple 3D populated logs, labeled as "realization 1," "realization 2," and "realization 3." As a general principle, uncertainty increases as distance increases from the known data points of the well trajectory.

Static model 112 can quantify uncertainty using neural network 300. As discussed above, static model 112 generates n random points for a 3D volume of the reservoir, and generates a set of feature vectors based on a distance between an observed data point along the well trajectory (e.g., log data) and each of the randomly generated n points for the reservoir volume. Notably, each feature vector includes corresponding log values from the well logs. Static model 112 further trains the neural network 108 with the feature vectors and propagates the values across the volume of the reservoir to generate predicted 3D log values, as discussed above.

The source of the uncertainty is the n random points. To address this uncertainty, static module 112 can modify or change the random points, which changes the training data for neural network 300 and thus, changes the predicted 3D log values. As such, neural network 300 generates a plurality predicted 3D log value realizations that are each different and equally probable. Static log values, such as porosity and permeability, are determined by mean log values across the realizations. The uncertainty can be quantified as a function over the number of realizations. The uncertainty can be calculated as a mean value or other cross-data evaluation techniques appreciated by those skilled in the art.

Figure 6:
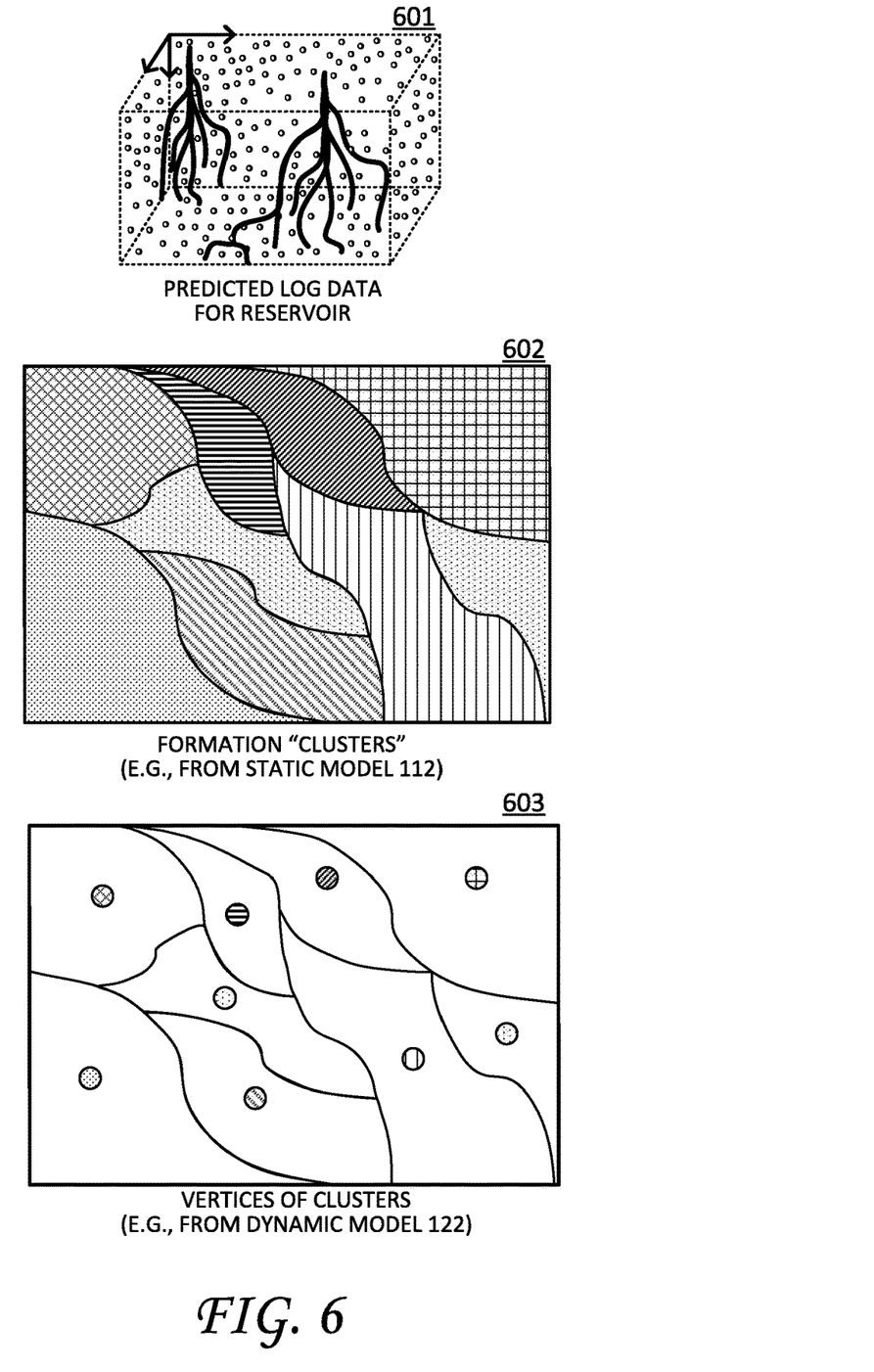
FIG. 6 illustrates a schematic block diagram of a process for translating predicted log data into cluster graphs of formations or node graphs of the formations.

FIG. 6 illustrates a schematic block diagram showing a process for translating (e.g., using discrete mathematics) predicted log data 601 into a cluster graph 602 and a node or vertex graph 603. Representing the reservoir in this graphical fashion helps integrate various data-derived attributes of rock properties with fundamental physics (e.g., fluid dynamics).

In particular, as discussed, static model module 110 generates log values (e.g., permeability, porosity, initial water saturation, and/or the like) from the 3D populated log realizations of the neural networks. In exemplary embodiments, the static log values are generated using a k-nearest neighbors algorithm, using an average of the different 3D populated log realizations. The k-nearest neighbors algorithm is thus performed over many instances for each desired property or characteristic. In addition, experts such as petrophysicists can assign certain rock properties, including porosity and permeability, which may be incorporated into the static model.

From the 3D populated static log values, the static model module 112 generates a static model of the reservoir. The static model may be further refined by dynamic module 120, where dynamic model module 122 analyzes the static model data and assigns portions of the reservoir to one or more clusters 602 based on predicted properties (e.g., rock types, porosity, permeability, etc.)

In one implementation, dynamic model module 122 uses k-means clustering, which partitions n observations into k clusters in which each observation belongs to the cluster with the nearest mean. The clusters of the static model obtained through the k-means clustering includes NPSS, RhoB, GR, and RDEEP values at each voxel of the 3D representation.

In addition, the clusters may be further represented as nodes or vertices 603 as part of a reservoir graph. Nodes or vertices 603 represent centoid of a cluster. In general, the raw static-cluster for each group are divided such that each cluster has at most one pressure observation point, only one well should pass through the cluster, and further, each cluster should contain spatially continuous voxel set only (a post-processing on the clusters can break the discontinuous clusters into continuous blobs). After applying the aforementioned rules, a smoothening algorithm may be applied to dissolve the very small clusters.

Figure 7:
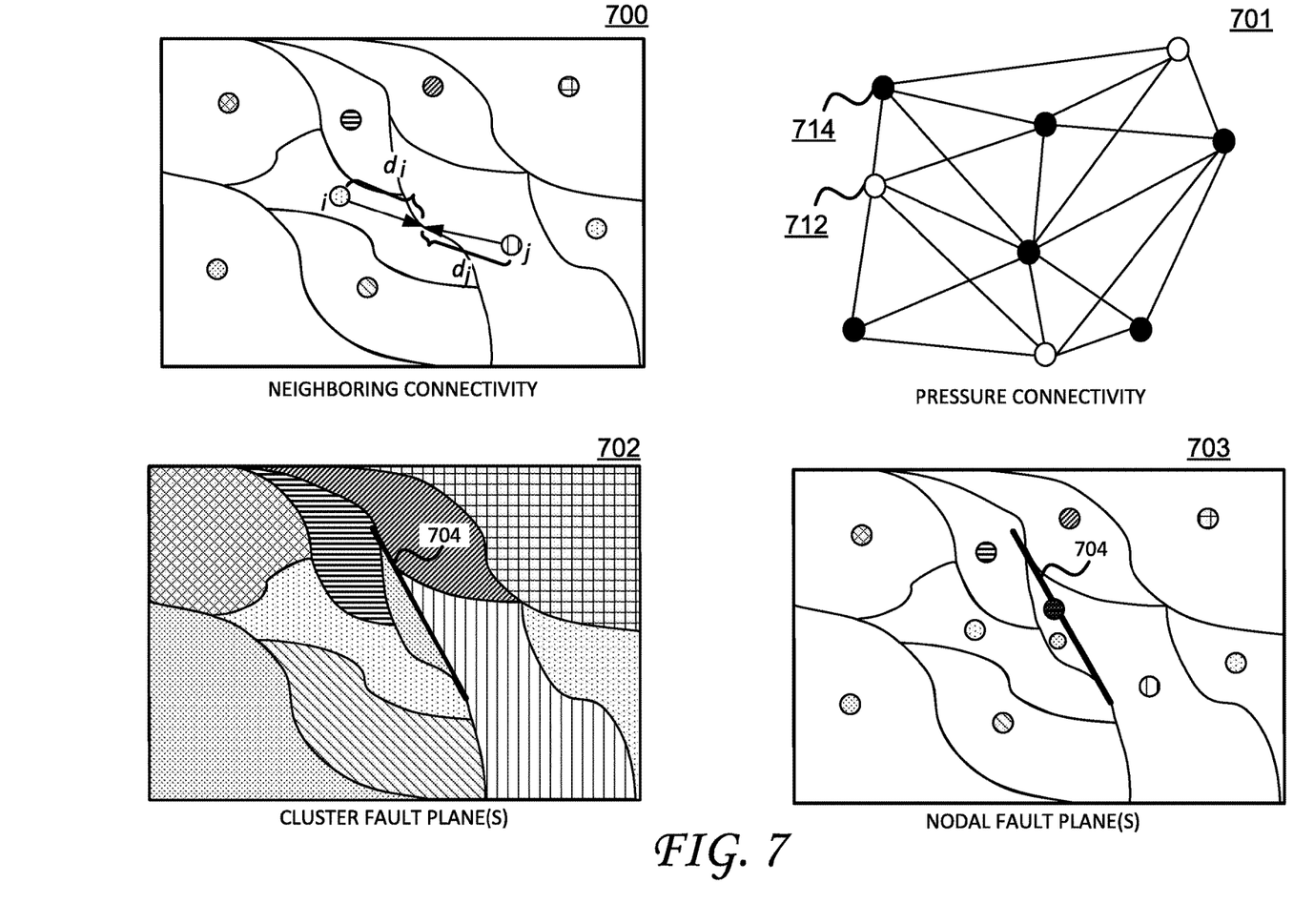
FIG. 7 illustrates various schematic diagrams representing neighboring connectivity, pressure connectivity, cluster fault planes, nodal fault planes.

FIG. 7 illustrates various schematic diagrams representing neighboring connectivity 700, pressure connectivity 701, cluster fault planes 702, nodal fault planes 703.

Referring to neighboring connectivity 700, the location $(x_i, y_i, z_i)$ is a center of mass for a set of connected voxels in the cluster i. The porosity $\varphi_i$ is an average porosity for voxels in the cluster i, and pore volume is $PV_{vi}: \Sigma_{vi}^N V_n \varphi_n$, where N is a number of voxels in the cluster i and $V_n$ and $\varphi_n$ respectively, are a volume and a porosity of voxel n in the cluster i.

The permeability $K_i$ is an average permeability of the cluster i. In one implementation, since the clusters are defined using permeability values, it is assumed the permeability is continuous in the cluster i. Stated differently, there should be no flow barrier (high permeability contrast) with the cluster itself, and permeability anisotropy is minimal. As such, directional permeability may be disregarded. In another implementation, the clusters are analyzed to ensure there is no flow barrier, however narrow, that can block an entire cross section in a given direction. Heterogeneity in permeability may be tolerated where it is dispersed in the space, and to account for this, directional permeability may be calculated for each of the clusters using a flow simulation or approximation. Similarly, the initial oil saturation $S_{oi}$ is an average initial saturation for voxels in the cluster i. A continuity for the initial oil saturation may be assured similar to the permeability.

In one implementation, the passing well name is the name of the well passing through the cluster i. With respect to fault, if the vertex represents a fault, the value is true. Otherwise, the value is false. In one implementation, if the vertex is a fault, its permeability is zero. In another implementation, if the vertex is a fault, the permeability may be manually or otherwise automatically specified based on the measured log data and/or the expert data.

In one implementation, the vertex i is is defined to be a neighbor of vertex j only if their parent clusters have a common surface $S_{ij}$. The area of $S_{ij}$ is denoted as $a_{ij}$ and the center point is $C_{ij}$ with $d_{ij}$ defined as the Euclidean distance from $(x_i, y_i, z_i)$ to $C_{ij}$. For each vertex $v_i$, adjacent vertices, shared area with neighbors, a central point of common surfaces, and other properties using neighbor identification algorithms for edge detection of the reservoir graph 302. The adjacent vertices includes a list of neighbors with vertex i. The shared area with neighbors includes a list of the areas between the vertex i and its neighbors, and the central common point of the common surfaces includes a list of the central point of common surfaces between the vertex i and its neighbors.

Once the edges are detected, a weight is assigned to the edge $(v_i, v_j)$ connecting vertices $v_i$ and $v_j$. In one implementation, the connectivity is defined by applying Darcy's law for a series system:

$$Q = \frac{K a_{ij}}{\mu} \frac{\Delta P}{(d_i + d_j)} \text{ and } K = \frac{d_i + d_j}{\sum_{n=i,j} \frac{d_n}{K_n}}$$

The effective permeability is therefore:

$$K_{ij} = \frac{K_i K_j}{(K_i d_i + K_j d_j)}$$

and the static connectivity is:

$$CS_{ij} = \frac{a_{ij} K_{ij}}{(d_i + d_j)}$$

The static weight is thus:

$$W_{s_{ij}} = \frac{a_{ij}}{\mu_0} \frac{K_i K_j}{(K_i d_i + K_j d_j)}$$

A time of travel is defined as a time it takes for a pressure drop in vertex i to be felt by vertex j. Using radius investigation in the context of a diffusivity equation, the travel distance or time of travel may be defined as:

$$t_{ij} = \frac{d_i^2 \varphi \mu C_t}{4 K_i} + \frac{d_j^2 \varphi \mu C_t}{4 K_j}$$

The nodes i, j, thus have static connectivity $D_{ij}$, pressure connectivity $CP_{ij}$, water connectivity $CW_{ij}$, and oil connectivity $CO_{ij}$ defined as follows:

$$D_{ij} = \frac{a_{ij} K_{ij}}{(d_i + d_j)}$$

$$CP_{ij} = \frac{a_{ij} K_{ij}}{\mu(d_i + d_j)} |P_i - P_j|$$

$$CW_{ij} = \frac{a_{ij} K_{w,ij}}{\mu_w(d_i + d_j)} |P_i - P_j|$$

$$CO_{ij} = \frac{a_{ij} K_{o,ij}}{\mu_o(d_i + d_j)} |P_i - P_j|$$

In one implementation, after clustering the reservoir domain, an observed pressure may be assigned to an intersecting cluster for a wellbore. As can be understood from a pressure connectivity representation 701, connectivity $w_{ij}$ between the cluster i and the cluster j may be used to populate pressure. More particularly, labeled clusters 712 are clusters with a pressure observation, and unlabeled clusters 714 are clusters where pressure will be populated. In one implementation, there may be connectivity values between the labeled clusters 712 and the unlabeled clusters 714 ($T_{uu}$) and between the unlabeled clusters 714 and other unlabeled clusters 714 ($T_{ul}$). An inversion formula based on graph connectivity therefore provides the pressure for the unlabeled clusters 714:

$$P_{unlabeled} = (i - T_{UU})^{-1} T_{UL} P_{observed}$$

As described herein, there are different realizations of the static models, as discussed above, which results in different clusters shown as reservoir graphs 602/702, which in turn results in different pressures shown in the representations 701.

Nodes with high connectivity are more likely to have similar pressures. Continuity in reservoir fluids allows for propagating pressure from observation points across the 3D network. The areas with no connectivity to the observation points are considered uncertain in pressure values. As such, when a new pressure point becomes available, the new pressure point is propagated across the volume, as it might represent an isolated section of the reservoir. The connectivity in the 3D structure is thus used to propagate pressure observations.

Turning to fault plane representations 702 and 703, an updated model of the clusters/vertices after the inclusions of a fault 704 is shown. Faults may be applied to edges of the clusters as shown by representations 702/703. In one implementation, dynamic model module 122 receives seismic data, which may be expertly labeled and include surfaces of one or more layers of the reservoir (e.g., three different layers) and fault data, including fault polygons. From the seismic data, dynamic model module 122 further generates fault planes through 3D plane fitting to add faults to the clusters of the static model, shown by cluster graph 702, or as a fault node to the vertex graph 703.

In one implementation, to add a fault to a cluster, a fault plane is imposed on the matrix of clusters, resulting in further division of the clusters. The fault, as shown in updated reservoir graph 702, redefines the boundaries of the system with new nodes. In one implementation, the points of a fault as collapsed into a vertex. The reservoir graphs 702/703 may be automatically updated with new fault planes. The fault planes act as nodes with zero or reduced permeability, and the faults change the permeability across the domain.

The illustrated reservoir graphs may have various nodal properties, graph traversal attributes, and/or the like. For example, the nodal properties may include, without limitation, vertex, vertex location, porosity, pre volume, permeability, vertex height, water saturation, static uncertainty, list perforations, fault, fault confidence, shale, aquifer, adjacent vertices, edge weights, time distance, boundary central voxel, shared area neighbors, pressure, and/or the like. The graph traversal attributes may include, without limitation, sorted path index, sorted path time, distance to aquifer, transmissibility, short term connected oil volume, cummulative production of short term interfering wells, short term accessible energy, short term connected water volume, short term connected oil volume uncertainty, medium term connected oil volume, cummulative productions of medium term interfering wells, medium term accessible energy, medium term connected water volume, medium term connected oil volume uncertainty, long term connected oil volume, cummulative production of long term interfering wells, long term accessible energy, long term connected water volume, long term connected oil volume uncertainty, number of nearby faults, average connectivity of nearby faults, average confidence of nearby faults, number of midway faults, average connectivity of midway faults, average confidence of midway faults, number of distant faults, average connectivity of distant faults, average confidence of distant faults, and/or the like.

Figure 8:
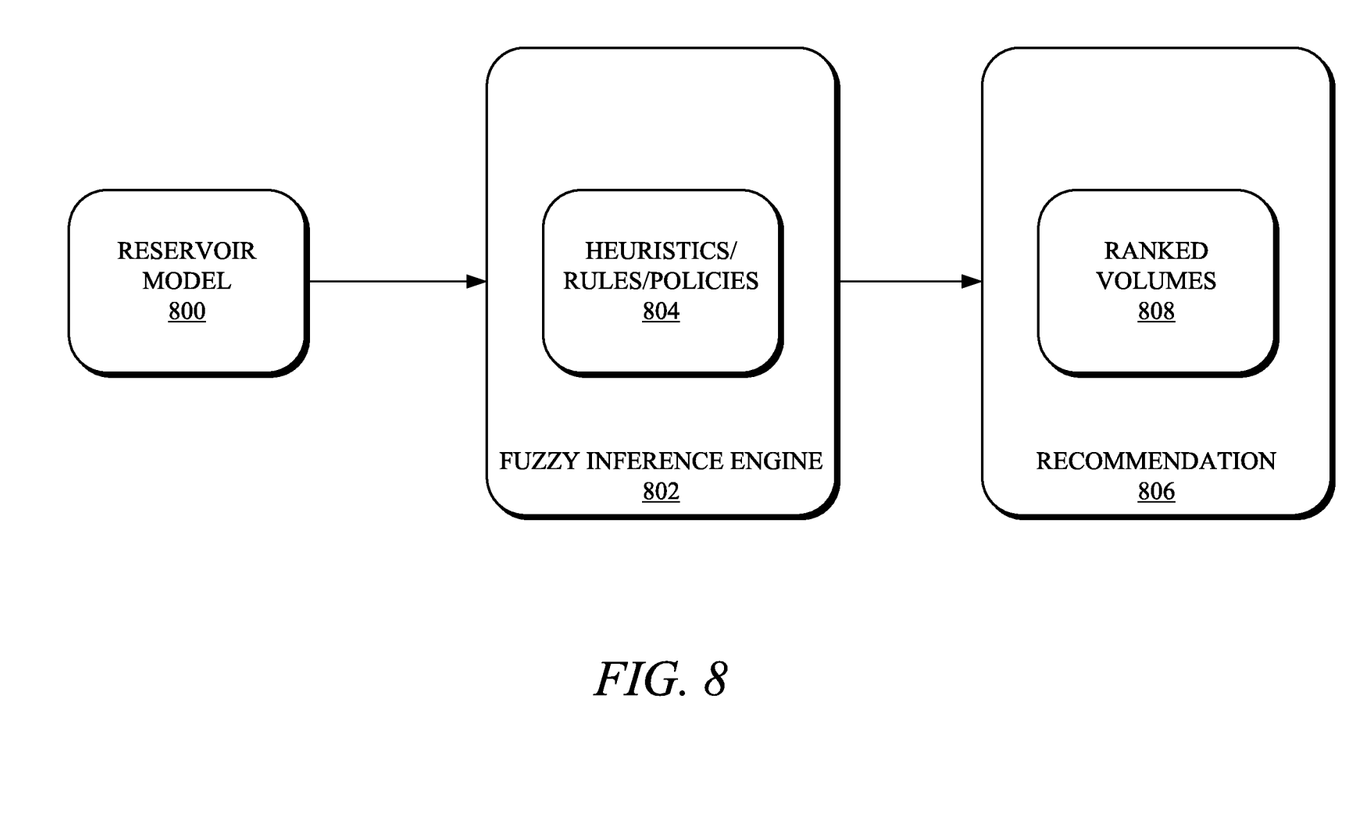
FIG. 8 illustrates a schematic block diagram of sub-modules of a recommendation module illustrated by the architecture shown in FIG. 1.

FIG. 8 illustrates a schematic block diagram of sub-modules of recommendation module 130. In particular, FIG. 8 illustrates an inference engine 802, which may form a component part of the recommendation module 130 and/or reservoir development reasoning model 132, discussed above. Fuzzy inference engine 802 generates a recommendation 806 by reasoning over an underlying reservoir model 800 and evaluating target volumes against a set of one or more rules 804. The fuzzy inference engine 802 may perform one or more stages of fuzzy inference.

Generally, fuzzy logic is a many-value logic that contrary to binary logic, where truth (i.e., a consistency with a proposition) is represented strictly with a 0 or 1 (i.e., true or false), models truth as a continuum with 0 and 1 being the boundaries. Within this context, in one implementation, reservoir development reasoning model 132 may generate a set of one or more input features computable from the static model and the dynamic model. For example, the set of features may include any number of features, such as a distance to aquifer, short term connected oil volume, long term accessible energy, and/or the like. Reservoir development reasoning model 132 utilizes the set of rules 804 relating the values of the set of features to a drilling attractiveness of a node, which is quantified for ranking. For example, if energy is high and connected water volume is low and connected oil volume is high and connected oil volume uncertainty is low, then drilling attractiveness is high. Similarly, if short term accessible energy is high and medium term accessible energy is high and long term accessible energy is high, then energy is high. As another example, if distance to aquifer is high then drilling attractiveness is high.

In binary logic, being characterized as high, would necessarily equate to the value being strictly true, with low being false. Conversely, the fuzzy inference engine 202 models high as a continuum where what is meant by high could be interpreted as highest (i.e., equal to 1), higher than some (i.e., greater than 0 but less than 1), and/or the like. As such, high, low, medium, etc. as used herein as linguistic variables. A linguistic variable is a term that indexes a particular part of a value spectrum. The fuzzy inference engine 802 maps the input features into the linguistic variables according to a membership function. This mapping carries an absolute value into an interpretation for high, low, medium, etc., which is then used to evaluate a corresponding rule. In one implementation, the membership functions utilized by the fuzzy inference engine 802 are based on a trapezoidal structure where minimum and maximum values are computed in light of an absolute minimum value and an absolute maximum value for each category examined for the reservoir.

From one reservoir to the next, an absolute volume of connected oil in a node may vary considerably. Reservoir development reasoning model 132 thus determines how any of the nodes in a particular reservoir compare to others with respect to a value of interest. As such, the membership functions utilized by the fuzzy inference engine 802 are fit to the intervals that emerge for a particular reservoir, with high at least including a particular maximum value and low at least including a particular minimum value as computed over all nodes in the particular reservoir. For example, if there are three nodes in a system having energy values {10, 20, 50}, the membership functions are overlaid on the interval {10, 50}, allowing the reservoir development reasoning model 132 to achieve an interpretation of which nodes are most attractive to drill relative to the others.

The recommendation 806 generated by recommendation module 130 can include a ranked volumes 808 where potential target regions for drillings are ranked in a list. For each of the rankings in the ranked volumes 808, recommendation module 130 provides an audit trail detailing, in relative and/or absolute terms, how the ranking was produced. Recommendation module 130 further monitors the static model 112 and the dynamic model 122 for updates, including new inputs and/or changes. If recommendation module 130 detects any updates, recommendation module 130 generates a reranking of the target regions to updated the ranked volumes 808 in real time.

In one implementation, a recommendation 806 generated by recommendation module 130 (and/or reservoir development reasoning model 132) includes ranked volumes 808 where potential target regions for drillings are ranked in a list. For each of the rankings in the ranked volumes 808, recommendation module 130 provides an audit trail detailing, in relative and/or absolute terms, how the ranking was produced. In one implementation, the recommendation 806 includes the audit trail according to the nature of how the set of rules is encoded in the policy. More particularly, the policy encodes a hierarchy of if/then rules. At each step in the hierarchical inference process, recommendation module 130 may also caches an input value of the input feature and an evaluation of the current rule in terms of the computed membership functions. Proceeding in a forward direction, recommendation module 130 reduces all the evaluations into a single quantified result. At this point, recommendation module 130 built a tree of what was evaluated. The audit trail thus includes the tree, which is traversable in the backward direction to analyze the underlying data and logic.

Recommendation module 130 further monitors the static model 112 and the dynamic model 122 for updates, including new inputs and/or changes. If recommendation module 130 detects any updates, it may further generate a reranking of the target regions to updated the ranked volumes 808 in real time.

Stated differently, in one implementation, recommendation module 130 executes a policy of the set of rules 804 defining desirable and undesirable volume features, and recommendation module 130 combines values for different categories hierarchically to produce an aggregate score for each of the ranked volumes 208. The ranked volumes 208 includes each of the target regions ranked in a list according to the aggregate scores. As such, the ranked volumes 208 are quantitative ratings, which are output as a user interface that a user may interact with using a user device to inspect the underlying rationale of the rankings to identify target regions for drilling.

Figure 9:
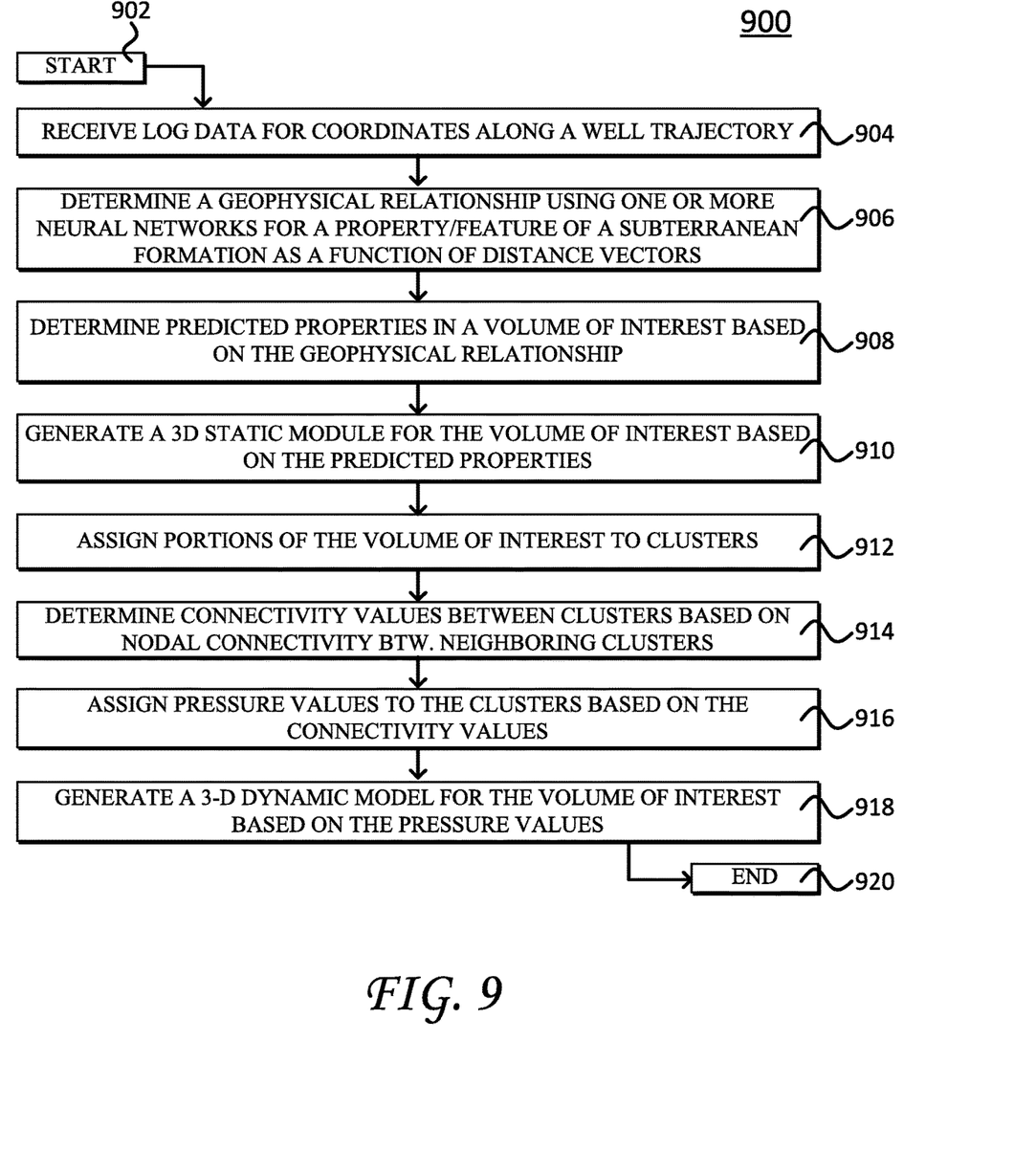
FIG. 9 illustrates an example simplified procedure for predicting characteristics of a 3D volume of interest such as a reservoir, in accordance with one or more embodiments of this disclosure.

FIG. 9 illustrates an example simplified procedure 900 for predicting characteristics of a 3D volume of interest (e.g., a reservoir), in accordance with one or more embodiments of the static modeling processes, dynamic modeling process, or the recommendation processes discussed in greater detail above.

Procedure 900 begins at step 902 and continues on to step 904 where, as discussed above, a static module receives log data for coordinates along a well trajectory. The static module further uses neural networks, at step 906, to determine a geophysical relationship for a property/feature of a subterranean formation as a function of distance vectors between the coordinates along the well trajectory and one or more sets of randomly generated coordinates. Next, at step 908, the static module further determines predicted properties a volume of interest, which can include the total volume of the reservoir, based on the geophysical relationship. At step 910, the static module generates a three-dimensional static model for the volume of interest based on the predicted properties.

As mentioned above, the volume of interest may be further broken down into clusters based on the predicted properties, as shown at step 912. For example, the dynamic module can operate in conjunction with the static module to group predicted properties at neighboring coordinate positions into a cluster. Alternatively, the dynamic module can create nodes or vertices based on the same. Moreover, the dynamic module may further determine connectivity values between clusters based on a nodal connectivity of neighboring clusters, at step 914. The connectivity values are further employed to assign pressure values (and/or water saturation values, and/or other fluid related values) across the volume of interest at step 916. At step 918, the dynamic module may further generate a three dimensional dynamic model for the volume of interest based on the assigned fluid values.

Procedure 900 subsequently ends at step 920, but may return again to step 902 where the static module receives log data for coordinates along a well trajectory. It should be noted that certain steps within procedure 900 may be optional, and further, the steps shown in FIG. 9 are merely example steps for illustration—certain other steps may be included or excluded as desired. Further, the particular order of the steps is merely illustrative, and it is appreciated that any suitable arrangement of the steps may be utilized without departing from the scope of the embodiments herein.

The techniques described herein, therefore, provide a comprehensive architecture for predicting and modeling characteristics of geological formations for a reservoir. The comprehensive architecture has been shown and described as including various modules, sub-modules, processes, and so on, however it is appreciated that such descriptions are not intended to be limiting. It is further appreciated that many of these processes and related operations may be performed by other modules (or sub-modules) without departing from the scope of this disclosure.

The foregoing description has been directed to specific embodiments. It will be apparent, however, that other variations and modifications may be made to the described embodiments, with the attainment of some or all of their advantages. For instance, it is expressly contemplated that the components, elements, and/or operations described herein can be implemented as software being stored on a tangible (non-transitory) computer-readable medium, devices, and memories (e.g., disks/CDs/RAM/EEPROM/ etc.) having program instructions executing on a computer, hardware, firmware, or a combination thereof. Further, methods describing the various functions and techniques described herein can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on. In addition, devices implementing methods according to these disclosures can comprise hardware, firmware and/or software, and can take any of a variety of form factors. Typical examples of such form factors include laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example. Instructions, media for conveying such instructions, computing resources for executing them, and other structures for supporting such computing resources are means for providing the functions described in these disclosures. Accordingly this description is to be taken only by way of example and not to otherwise limit the scope of the embodiments herein. Therefore, it is the object of the appended claims to cover all such variations and modifications as come within the true spirit and scope of the embodiments herein.

The invention claimed is:

1. A method for predicting geological characteristics of a reservoir, the method comprising:
receiving log data for coordinates along a well trajectory;
a predicting geophysical properties for one or more sets of randomly generated coordinates of a volume of interest surrounding the well trajectory based on one or more neural networks, wherein the geophysical properties for the one or more sets of randomly generated coordinates are predicted based on a function of distance vectors between the one or more sets of randomly generated coordinates and geophysical properties measured at known coordinates along the well trajectory;
generating a three-dimensional static model for the volume of interest based on the predicted geophysical properties;
assigning portions of the volume of interest to one or more clusters based on the predicted geophysical properties;
determining connectivity values between clusters based on a nodal connectivity of neighboring clusters;
assigning pressure values across the volume of interest of the three-dimensional static model based on the connectivity values; and
generating a three-dimensional dynamic model for the volume of interest based on the pressure values and the three-dimensional static model.

2. The method of claim 1, further comprising:
evaluating the three-dimensional static model and the three-dimensional dynamic model based on a set of rules executed by a fuzzy inference engine; and
providing a recommendation for drilling a wellbore in the volume of interest.

3. The method of claim 1, further comprising training the one or more neural networks to identify a geophysical relationship for a property of a subterranean formation as a function of distance vectors using the distance vectors as an input and the log data for coordinates along the well trajectory as an output.

4. The method of claim 1, further comprising:
generating a plurality of static model realizations using the one or more neural networks based on a plurality of sets of randomly generated coordinates; and
quantifying an uncertainty value using the one or more neural networks based on the plurality of the static model realizations.

5. The method of claim 1, further comprising adjusting the three-dimensional dynamic model based on predicted changes in pressure values over time.

6. The method of claim 1, further comprising assigning saturation values across the volume of interest of the three-dimensional static model based on the connectivity values, and wherein generating the three-dimensional dynamic model further comprises generating the three-dimensional dynamic model based on the pressure values and the saturation values.

7. The method of claim 6, further comprising adjusting the three-dimensional dynamic model based on predicted changes in saturation values over time.

8. The method of claim 1, wherein the predicted geophysical properties include at least one of a location, a porosity, a permeability, or an initial saturation.

9. The method of claim 1, further comprising defining a fault plane in the volume of interest for at least one of the three-dimensional static model or the three-dimensional dynamic model, wherein the at least one fault plane acts as a node with zero or reduced permeability.

10. A system for predicting geological characteristics of a reservoir, the system comprising:
one or more neural networks configured to:
receive log data for coordinates along a well trajectory; and
predict geophysical properties for one or more sets of randomly generated coordinates of a volume of interest surrounding the well trajectory, wherein the geophysical properties for the one or more sets of randomly generated coordinates are predicted based on a function of distance vectors between the one or more sets of randomly generated coordinates and geophysical properties measured at known coordinates along the well trajectory;
a static modeling module in communication with the one or more neural networks, the static modeling module is configured to generate a three-dimensional static model for the volume of interest based on the predicted geophysical properties; and a dynamic modeling module in communication with the static module, the dynamic module is configured to:
assign portions of the volume of interest to one or more clusters based on the predicted geophysical properties;
determine connectivity values between clusters based on a nodal connectivity of neighboring clusters;
assign pressure values across the volume of interest of the three-dimensional static model based on the connectivity values; and
generate a three-dimensional dynamic model for the volume of interest based on the pressure values.

11. The system of claim 10, further comprising a fuzzy inference engine in communication with the static modeling module and the dynamic modeling module, the fuzzy inference engine is configured to:
evaluate the three-dimensional static model and the three-dimensional dynamic model based on a set of rules executed by a fuzzy interference engine; and
provide a recommendation for drilling a wellbore in the volume of interest based on a predetermined policy ruleset.

12. The system of claim 10, wherein the one or more neural networks are trained to determine a geophysical relationship for a property of a subterranean formation as a function of distance vectors using the distance vectors as an input and the log data for coordinates along the well trajectory as an output.

13. The system of claim 10, wherein the one or more neural networks is further configured to:
generate a plurality of static model realizations based on a plurality of sets of randomly generated coordinates; and
quantify an uncertainty value based on the plurality the static model realizations.

14. The system of claim 10, wherein the dynamic modeling module is further configured to adjust the three-dimensional dynamic model based on predicted changes in pressure values over time.

15. The system of claim 10, wherein the dynamic modeling module is further configured to:
assign saturation values across the volume of interest of the three-dimensional static model based on the connectivity values; and
generate the three-dimensional dynamic model based on the saturation values.

16. The system of claim 10, wherein the dynamic modeling module is further configured ton adjust the three-dimensional dynamic model based on predicted changes in saturation values over time.

17. The system of claim 10, wherein the predicted geophysical properties include at least one of a location, a porosity, a permeability, or an initial saturation.

18. A tangible, non-transitory, computer-readable storage media having instructions encoded thereon and executable by a processor to perform a method for predicting geological characteristics of a reservoir, the method comprising:
receiving log data for coordinates along a well trajectory;
predicting geophysical properties for one or more sets of randomly generated coordinates of a volume of interest surrounding the well trajectory based on one or more neural networks, wherein the geophysical properties for the one or more sets of randomly generated coordinates are predicted based on a function of distance vectors between the one or more sets of randomly generated coordinates; and geophysical properties measured at known coordinates along the well trajectory;
generating a three-dimensional static model for the volume of interest based on the predicted geophysical properties;
assigning portions of the volume of interest to one or more clusters based on the predicted geophysical properties;
determining connectivity values between clusters based on a nodal connectivity of neighboring clusters;
assigning pressure values across the volume of interest of the three-dimensional static model based on the connectivity values; and
generating a three-dimensional dynamic model for the volume of interest based on the pressure values.

19. The tangible, non-transitory, computer-readable storage media of claim 18, further comprising instructions executable by the processor to:
evaluate the three-dimensional static model and the three-dimensional dynamic model based on a set of rules executed by a fuzzy interference engine; and
provide a recommendation for drilling a wellbore in the volume of interest.

20. The tangible, non-transitory, computer-readable storage media of claim 18, further comprising instructions executable to train the one or more neural networks to identify a geophysical relationship for a property of a subterranean formation as a function of distance vectors using the distance vectors as an input and the log data for coordinates along the well trajectory as an output.

* * * * *